US012692624B2

(12) United States Patent
Mikawa et al.

(10) Patent No.: US 12,692,624 B2
(45) Date of Patent: Jul. 28, 2026

(54) GALLIUM NITRIDE CRYSTAL, GALLIUM NITRIDE SUBSTRATE, AND METHOD FOR PRODUCING GALLIUM NITRIDE CRYSTAL

(71) Applicants: MITSUBISHI CHEMICAL CORPORATION, Tokyo (JP); THE JAPAN STEEL WORKS, LTD., Tokyo (JP)

(72) Inventors: Yutaka Mikawa, Miyagi (JP); Kouhei Kurimoto, Hokkaido (JP); Quanxi Bao, Hokkaido (JP)

(73) Assignees: MITSUBISHI CHEMICAL CORPORATION, Tokyo (JP); THE JAPAN STEEL WORKS, LTD., Tokyo (JP)

( * ) Notice: Subject to any disclaimer, the term of this patent is extended or adjusted under 35 U.S.C. 154(b) by 130 days.

(21) Appl. No.: 18/585,407

(22) Filed: Feb. 23, 2024

(65) Prior Publication Data

US 2024/0191395 A1 Jun. 13, 2024

Related U.S. Application Data

(63) Continuation of application No. PCT/JP2022/031744, filed on Aug. 23, 2022.

(30) Foreign Application Priority Data

Aug. 25, 2021 (JP) ................................ 2021-137526

(51) Int. Cl.
 *C30B 29/40* (2006.01)
 *C30B 7/10* (2006.01)
(52) U.S. Cl.
 CPC ............ *C30B 29/406* (2013.01); *C30B 7/105* (2013.01)

(58) Field of Classification Search
 CPC .............................. C30B 29/406; C30B 7/105
 (Continued)

(56) References Cited

U.S. PATENT DOCUMENTS 9,673,046 B2 6/2017 Tsukada et al.
10,734,485 B2 8/2020 Tsukada et al.
 (Continued)

FOREIGN PATENT DOCUMENTS

CN 111593398 A 8/2020
JP 2003277182 A 10/2003
 (Continued)

OTHER PUBLICATIONS

International Preliminary Report on Patentability and Written Opinion issued Feb. 27, 2024 in PCT/JP2022/031744 (with English translation), 10 pages.
 (Continued)

*Primary Examiner* — Betelhem Shewareged
(74) *Attorney, Agent, or Firm* — Element IP, PLC

(57) ABSTRACT

A gallium nitride crystal contains F. A total content of halogen elements other than F in the gallium nitride crystal is 1/100 or less of a content of F. The gallium nitride crystal includes a main surface 1 having an inclination of 0 to 10 degrees from a (000-1) crystal plane. The main surface 1 is a specific main surface A satisfying a specific condition regarding facet growth region, in which a first line segment, which is a virtual line segment extending in a first direction on the specific main surface A and having a length of 40 mm, and a second line segment, which is a virtual line segment extending in a second direction perpendicular to the first direction on the specific main surface A and having a length of 40 mm, can be drawn. The gallium nitride crystal has specific crystal defects curbed and is of high quality.

16 Claims, 3 Drawing Sheets

(58) Field of Classification Search
USPC .......................................................... 428/220
See application file for complete search history.

(56) References Cited

U.S. PATENT DOCUMENTS

| | | | |
|---|---|---|---|
| 11,670,687 B2 | 6/2023 | Tsukada et al. | |
| 2009/0309105 A1 | 12/2009 | Letts et al. | |
| 2011/0268645 A1 | 11/2011 | Mikawa et al. | |
| 2012/0164057 A1* | 6/2012 | Fujisawa | C30B 29/406 |
| | | | 117/64 |
| 2013/0032013 A1 | 2/2013 | Mikami et al. | |
| 2013/0061841 A1 | 3/2013 | Matsumoto et al. | |
| 2014/0147650 A1 | 5/2014 | Jiang et al. | |
| 2015/0361587 A1* | 12/2015 | Mikawa | C30B 7/105 |
| | | | 423/409 |
| 2016/0319460 A1 | 11/2016 | Tsukada et al. | |
| 2019/0189438 A1* | 6/2019 | Mikawa | C30B 33/06 |
| 2024/0191395 A1* | 6/2024 | Mikawa | C30B 29/406 |

FOREIGN PATENT DOCUMENTS

| | | | |
|---|---|---|---|
| JP | 2005008444 A | 1/2005 | |
| JP | 2011068545 A | 4/2011 | |
| JP | 2013038116 A | 2/2013 | |
| JP | 2013056398 A | 3/2013 | |
| JP | 2014062017 A | 4/2014 | |
| JP | 2015178438 A | 10/2015 | |
| JP | 2018024538 A | 2/2018 | |
| TW | I598478 B | 9/2017 | |
| WO | WO-2015107813 A1 | 7/2015 | |

OTHER PUBLICATIONS

International Search Report issued Oct. 4, 2022 in PCT/JP2022/031744 (with English translation), 11 pages.

Extended European Search Report issued Jul. 21, 2025, in corresponding European Patent Application No. 22861365.9, 10 pages.

Mikawa Yutaka et al: "Ammonothermal growth of polar and non-polar bulk GaN crystal", Mar. 12, 2015, vol. 9363, Mar. 12, 2015, pp. 936302-1-936302-6, XP060060131.

Partial Supplementary European Search Report issued Apr. 29, 2025, in corresponding European Patent Application No. 22861365.9, 13 pages.

Combined Taiwanese Office Action and Search Report issued Feb. 25, 2026, in corresponding Taiwanese Patent Application No. 111131668 (with English Translation), 8 pages.

Office Action issued Apr. 21, 2026, in corresponding Korean Patent Application No. 10-2024-7009295 (with English Machine Translation), 18 pages.

* cited by examiner

Fig.1

GALLIUM NITRIDE CRYSTAL, GALLIUM NITRIDE SUBSTRATE, AND METHOD FOR PRODUCING GALLIUM NITRIDE CRYSTAL

CROSS-REFERENCE TO RELATED APPLICATIONS

This application is a continuation of PCT International Application No. PCT/JP2022/031744 filed on Aug. 23, 2022, which claims priority under 35 U.S.C. § 119 (a) to Japanese Patent Application No. 2021-137526 filed on Aug. 25, 2021, the entire content of which is incorporated herein by reference.

BACKGROUND OF THE INVENTION

1. Field of the Invention

The present invention mainly relates to a gallium nitride crystal.

2. Description of the Related Art

Conventionally, gallium nitride (GaN) crystals have a large band gap, and have a direct transition type inter-band transition, and thus, gallium nitride (GaN) crystals are used as semiconductor materials, and are used for various semiconductor devices such as light emitting diodes of ultraviolet, blue, and the like, and light emitting elements of a relatively short wavelength such as those in semiconductor lasers, electronic elements, and semiconductor sensors.

In recent years, GaN crystals have been used in power semiconductor elements (power devices) and high-frequency power devices, in addition to light emitting device applications. For this reason, development of GaN crystals that can withstand high voltage and large current has advanced.

In addition, it is preferable that these devices be produced using a high-quality semiconductor substrate (free-standing substrate) made of the same kind of material and having few crystal defects, and a technique of producing a GaN crystal that can be used for such semiconductor substrates has been actively studied.

As a method for producing a GaN crystal, a liquid phase growth method such as an ammonothermal method, a vapor phase growth method such as a hydride vapor phase growth method (HVPE method), and the like are known.

The HVPE method is a method in which a chloride of Ga and $NH_3$ are introduced into a furnace in a hydrogen stream and thermally decomposed to deposit crystals generated by thermal decomposition on a substrate.

On the other hand, the ammonothermal method is a method for producing a desired crystal material using a solvent containing nitrogen such as ammonia in a super-critical state and/or a subcritical state and a dissolution-precipitation reaction of a raw material. When applied to crystal growth, a supersaturated state is generated by a temperature difference using a temperature dependence of a raw material solubility in a nitrogen-containing solvent such as ammonia to precipitate crystals. Specifically, a crystal raw material or a seed crystal is placed in a pressure-resistant container such as an autoclave and the container is sealed, and heated by a heater or the like to form a high temperature range and a low temperature range in the pressure-resistant container, and the raw material is dissolved in one of the ranges and the crystal is grown in the other range, whereby a crystal can be produced (see, for example, JP 2003-277182 A, JP 2005-8444 A, and JP 2011-68545 A).

The ammonothermal method is advantageous in that a raw material utilization efficiency is higher than that of the HVPE method and production costs can be curbed. In addition, since the ammonothermal method can achieve high quality and a large diameter for GaN crystals, practical use thereof has advanced in recent years.

SUMMARY OF THE INVENTION

As described above, the crystal growth of GaN by the ammonothermal method is advantageous from the viewpoint of curbing production costs and achieving high quality and a large diameter for crystals. On the other hand, according to studies of the present inventors, it has been found that a GaN crystal obtained by the ammonothermal method may gain a specific crystal defect in a growth process thereof, and there is still room for improvement from the viewpoint of crystal quality.

Under such circumstances, an object of the present invention is to provide a high quality GaN crystal and GaN substrate with few specific crystal defects.

As a result of intensive studies to solve the above problems, the present inventors have succeeded in producing a GaN crystal in which generation of specific crystal defects is curbed.

In addition, the present inventors have found that, in the ammonothermal method, a GaN crystal in which generation of specific crystal defects is curbed can be obtained by using a specific seed crystal and setting a pressure condition and a temperature condition in a crystal growth step to specific ranges, thereby completing the present invention.

Embodiments of the present invention include, but are not limited to the following description.

[1] A gallium nitride crystal which contains F and in which a total content of halogen elements other than F is $1/100$ or less of a content of F, the gallium nitride crystal including a main surface 1 having an inclination of 0 degrees or more and 10 degrees or less from a (000-1) crystal plane, wherein the main surface 1 is a specific main surface A satisfying at least one of the following conditions (A1) to (A3).

(A1) A first line segment which is a virtual line segment extending in a first direction on the specific main surface A and having a length of 40 mm and a second line segment which is a virtual line segment extending in a second direction perpendicular to the first direction on the specific main surface A and having a length of 40 mm can be drawn, and a facet growth region density in a random square region of 10 mm×10 mm on the specific main surface A does not exceed 500 $cm^{-2}$.

(A2) A first line segment which is a virtual line segment extending in a first direction on the specific main surface A and having a length of 40 mm and a second line segment which is a virtual line segment extending in a second direction perpendicular to the first direction on the specific main surface A and having a length of 40 mm can be drawn, and at least one square region of 20 mm×20 mm having a facet growth region density of less than 5 $cm^{-2}$ is found in the specific main surface A.

(A3) A first line segment which is a virtual line segment extending in a first direction on the specific main surface A and having a length of 40 mm and a second line segment which is a virtual line segment extending in a second direction perpendicular to the first direction on the specific main surface A and having a length of 40 mm can be drawn, and a ratio of a total area of facet growth regions to an area of the specific main surface A (total area of facet growth regions/area of specific main surface A) is 40% or less.

[2] The gallium nitride crystal according to [1], further including: a main surface 2 having an inclination of 0 degrees or more and 10 degrees or less from a (0001) crystal plane which is a main surface on an opposite side.

[3] The gallium nitride crystal according to [1] or [2], wherein fluorine is contained at a concentration of $1\times10^{15}$ atoms/cm$^3$ or more and $1\times10^{18}$ atoms/cm$^3$ or less.

[4] The gallium nitride crystal according to any one of [1] to [3], wherein the main surface 1 includes a specific main surface A that simultaneously satisfies the condition (A1) and the condition (A2) or the condition (A3), or the main surface 1 includes a specific main surface A that simultaneously satisfies the condition (A1), the condition (A2), and the condition (A3).

[5] The gallium nitride crystal according to any one of [1] to [3], wherein the main surface 1 includes a specific main surface A that simultaneously satisfies the condition (A2) and the condition (A3).

[6] The gallium nitride crystal according to any one of [1] to [5], wherein the main surface 1 is a specific main surface A further satisfying the following condition (B1).

(B1) A maximum value of FWHM of an XRC among all measurement points is less than 40 arcsec when an XRC of 002 reflection is measured at an interval of 5 mm on the first line segment with an X-ray incident surface during each ω-scan parallel to the first line segment.

[7] The gallium nitride crystal according to any one of [1] to [6], wherein the main surface 1 is a specific main surface A further satisfying the following condition (B2).

(B2) A difference between a maximum value and a minimum value of a peak angle of an XRC among all measurement points is less than 0.2° when an XRC of 002 reflection is measured at an interval of 5 mm on the first line segment with an X-ray incident surface during each ω-scan parallel to the first line segment.

[8] The gallium nitride crystal according to any one of [1] to [7], wherein a dislocation density is less than $1\times10^6$ cm$^{-2}$.

[9] The gallium nitride crystal according to any one of [1] to [8], wherein a hydrogen concentration is $2\times10^{19}$ atoms/cm$^3$ or less.

[10] The gallium nitride crystal according to any one of [1] to [9], wherein an oxygen concentration is $2\times10^{19}$ atoms/cm$^3$ or less.

[11] A gallium nitride crystal including: a main surface 1 having an inclination of 0 degrees or more and 10 degrees or less from a (000-1) crystal plane; and a main surface 2, having an inclination of 0 degrees or more and 10 degrees or less from a (0001) crystal plane which is a main surface on an opposite side, wherein a thickness in a c-axis direction is 1 mm or more, and an area ratio between a main area 1 and a main area 2 (main area 1/main area 2) is 0.5 or more and 1 or less.

[12]×A gallium nitride crystal including: a main surface 1 having an inclination of 0 degrees or more and 10 degrees or less from a (000-1) crystal plane; and a main surface 2, having an inclination of 0 degrees or more and 10 degrees or less from a (0001) crystal plane which is a main surface on an opposite side, wherein a thickness in a c-axis direction is 1 mm or more, and an area ratio between a (10-1-1) plane and a (10-1-2) plane satisfies the following relational expression (C).

$$\text{Area of(10-1-2)plane/\{area of(10-1-1)plane+area of(10-1-2)plane\}} < 0.5 \qquad \text{(C)}$$

[13] A gallium nitride substrate obtained by slicing the gallium nitride crystal according to any one of [1] to [12].

[14] A method for producing a gallium nitride crystal including: a seed preparation step of preparing a GaN seed which is obtained by a liquid phase growth method and has a nitrogen polar surface; and a crystal growth step of growing a GaN crystal on the nitrogen polar surface of the GaN seed by an ammonothermal method by setting a pressure in a reaction vessel containing a mineralizer containing fluorine to 200 MPa or less and a temperature of a crystal growth region to 600° C. or higher.

[15] The method for producing a gallium nitride crystal according to [14], wherein an area of the nitrogen polar surface of the GaN seed is 30 cm$^2$ or more.

According to the present disclosure, it is possible to provide a high quality GaN crystal and GaN substrate with few specific crystal defects.

BRIEF DESCRIPTION OF THE DRAWINGS

FIG. 1 is a schematic view of a crystal production device that can be used in an embodiment of the present invention.

DESCRIPTION OF THE PREFERRED EMBODIMENTS

Figure 2:
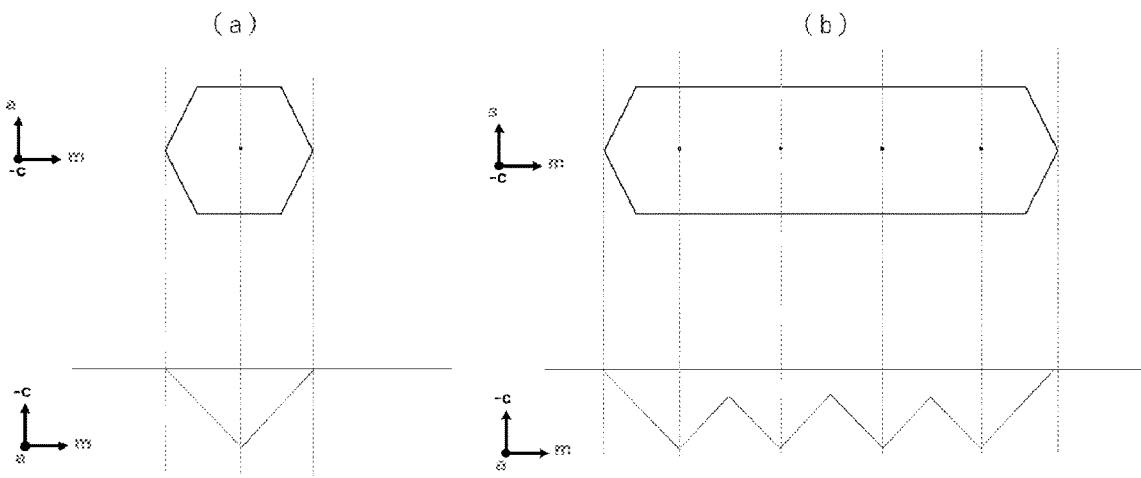
FIG. 2 is a schematic view illustrating an example of a facet growth region in the present disclosure.

In a gallium nitride crystal, a (0001) crystal plane and a (000-1) crystal plane are collectively referred to as a c-plane, a {10-10} crystal plane is referred to as an m-plane, and a {11-20} crystal plane is referred to as an a-plane. A crystal axis perpendicular to the c-plane is called a c-axis, a crystal axis perpendicular to the m-plane is called an m-axis, and a crystal axis perpendicular to the a-plane is called an a-axis.

In the present specification, when referring to a crystal axis, a crystal plane, a crystal orientation, or the like, this means a crystal axis, a crystal plane, a crystal orientation, or the like of a GaN crystal unless otherwise specified.

The Miller indices (hkil) of hexagonal crystals are expressed in three digits as (hkl) because of the relationship of h+k=i. For example, (0002) is expressed as (002) in three digits.

In the present specification, for convenience, the (0001) crystal plane and the (000-1) crystal plane may be collectively referred to as a (000±1) crystal plane. Also, in the drawings, a direction may be represented as a +c direction, and a [000-1] direction may be represented as a −c direction.

Hereinafter, gallium nitride according to one embodiment of the present invention, a method for producing the same, and a crystal production device and a member used for producing the same will be described in detail. The description of the components described below may be made based on a representative embodiment of the present invention, but the present invention is not limited to such an embodiment.

In the present specification, a numerical range represented by "to" means a range including numerical values stated before and after "to" as a lower limit value and an upper limit value.

<Gallium Nitride Crystal>

A first embodiment of the present invention relates to a gallium nitride crystal.

A first aspect of a gallium nitride (GaN) crystal (hereinafter, also simply referred to as a "GaN crystal") according to the first embodiment of the present invention is a gallium nitride crystal including a main surface 1 having an inclination of 0 degrees or more and 10 degrees or less from a (000-1) crystal plane, in which the main surface 1 is a specific main surface A satisfying the following condition (A1).

(A1) A first line segment which is a virtual line segment extending in a first direction on the specific main surface A and having a length of 40 mm and a second line segment which is a virtual line segment extending in a second direction perpendicular to the first direction on the specific main surface A and having a length of 40 mm can be drawn, and a facet growth region density in a random square region of 1 cm×1 cm on the specific main surface A does not exceed 100 cm$^{-2}$.

The GaN crystal of the first aspect preferably includes a main surface 2, having an inclination of 0 degrees or more and 10 degrees or less from a (0001) crystal plane which is a main surface on an opposite side of the main surface 1.

A second aspect of the GaN crystal according to an embodiment of the present invention is a gallium nitride crystal including a main surface 1 having an inclination of 0 degrees or more and 10 degrees or less from a (000-1) crystal plane, in which the main surface 1 is a specific main surface A satisfying the following condition (A2).

(A2) A first line segment which is a virtual line segment extending in a first direction on the specific main surface A and having a length of 40 mm and a second line segment which is a virtual line segment extending in a second direction perpendicular to the first direction on the specific main surface A and having a length of 40 mm can be drawn, and at least one square region of 2 cm×2 cm having a facet growth region density of less than 5 cm$^{-2}$ is found in the specific main surface A.

The GaN crystal of the second aspect preferably includes a main surface 2, having an inclination of 0 degrees or more and 10 degrees or less from a (0001) crystal plane which is a main surface on an opposite side of the main surface 1.

A third aspect of the GaN crystal according to an embodiment of the present invention is a gallium nitride crystal including a main surface 1 having an inclination of 0 degrees or more and 10 degrees or less from a (000-1) crystal plane and a main surface 2, having an inclination of 0 degrees or more and 10 degrees or less from a (0001) crystal plane which is a main surface on an opposite side, in which the main surface 1 is a specific main surface A satisfying the following condition (A3).

(A3) A first line segment which is a virtual line segment extending in a first direction on the specific main surface A and having a length of 40 mm and a second line segment which is a virtual line segment extending in a second direction perpendicular to the first direction on the specific main surface A and having a length of 40 mm can be drawn, and a ratio of an area of facet growth regions to an area of the specific main surface A (area of facet growth regions/area of specific main surface A) is 10% or less.

The GaN crystal of the third aspect preferably includes the main surface 2, having an inclination of 0 degrees or more and 10 degrees or less from a (0001) crystal plane which is a main surface on an opposite side of the main surface 1.

In the present specification, the facet growth region refers to a closed region where crystal-is grown in a plane orientation different from that of the main surface 1. The plane orientation is not particularly limited, and examples thereof include a (10-1-1) plane, a (10-1-2) plane, and the like. A shape of the facet growth region is not particularly limited, and may typically be a hexagon or a polygon. In a crystal growth process, the facet growth region may typically be formed as a pit structure, but the facet growth region in the present disclosure is not limited to a pit structure. For example, the concept includes a case where a facet growth region is present on a surface in a case where a pit structure is removed by polishing a main surface.

An example of an aspect of the facet growth region will be described.

The facet growth region is typically observed as a hexagon or polygon on the main surface 1, but may be observed as a hexagonal pyramid or a polygonal pyramid shape when viewed from a cross-section in a direction perpendicular to the main surface 1. A diameter of the hexagon or polygon is typically 5 to 300 μm. FIG. 2(*a*) illustrates an example of such a case.

In a case where a plurality of hexagons or polygons are close to each other, the facet growth region may be observed as an integrated shape on the main surface 1. In this case, when viewed from a cross-section in a direction perpendicular to the main surface 1, apexes of a plurality of hexagonal pyramids or polygonal pyramids can be separately observed. In a case where a plurality of facet growth regions is integrally observed as described above, when apexes of individual hexagonal pyramids or polygonal pyramids constituting a facet growth region to be integrally observed can be specified, the number of facet growth regions may be counted using the number of apexes when calculating a facet growth region density to be described later. FIG. 2(*b*) illustrates an example of such a case.

In the (A1) and (A2), the facet growth region density refers to the number of facet growth regions observed in a random square region on the main surface 1 divided by the area of the square region. Specifically, in the (A1), the calculation is performed by dividing the number of facet growth regions observed in a square region of 1 cm×1 cm by the area of the square region. In the (A2), the calculation is performed by dividing the number of facet growth regions observed in a square region of 2 cm×2 cm by the area of the square region. A method for observing the number of facet growth regions is not particularly limited as long as the facet growth regions can be specified, and for example, a method for observing the number of pits derived from the facet growth regions visually or with a microscope or the like, a method for observing bright regions of a yellow band in a photoluminescence (PL) image, or the like can be used.

The GaN crystal in the first aspect has a specific main surface A satisfying the condition (A1). That is, when a random 1 cm×1 cm square region is taken on the main surface 1 of the GaN crystal, it is required that the facet growth region density in the square region do not exceed 500 cm$^{-2}$ for all the square regions. The facet growth region density is preferably 100 cm$^{-2}$ or less, more preferably 80 cm$^{-2}$ or less, still more preferably 50 cm$^{-2}$ or less, still further preferably 30 cm$^{-2}$ or less, and particularly preferably 10 cm$^{-2}$ or less. In this case, a GaN substrate having few defects and excellent yield during device formation or the like can be obtained with high productivity.

The GaN crystal in the second aspect has a specific main surface A satisfying the condition (A2). That is, it is required that at least one square region of 2 cm×2 cm having a facet growth region density of less than 5 cm$^{-2}$ be found on the main surface 1 of the GaN crystal. The facet growth region density is preferably less than 4 cm$^{-2}$, more preferably 3 cm$^{-2}$ or less, and particularly preferably less than 2 cm$^{-2}$. In this case, a GaN substrate having few defects and excellent yield during device formation or the like can be obtained with high productivity.

The GaN crystal in the third aspect has a specific main surface A satisfying the condition (A3). That is, it is required that an area ratio of a total facet growth region to an area of the specific main surface A of the GaN crystal (total area of facet growth regions/area of specific main surface A) be 40% or less. The area ratio of the total facet growth regions to the area of the specific main surface A is preferably 20% or less, more preferably 10% or less, still more preferably 8% or less, still further preferably 6% or less, and particularly preferably 5% or less.

In the GaN crystal according to the first aspect, it is preferable that the specific main surface A further satisfy either the condition (A2) or (A3). That is, in the GaN crystal, it is preferable that the main surface 1 include a specific main surface A that simultaneously satisfies the condition (A1) and the condition (A2) or the condition (A3). In the GaN crystal according to the first aspect, it is particularly preferable that the main surface 1 include a specific main surface A that simultaneously satisfies the condition (A1), the condition (A2), and the condition (A3).

In the GaN crystal according to the second aspect, it is preferable that the specific main surface A further satisfy the condition (A3). That is, in the GaN crystal, it is preferable that the main surface 1 include a specific main surface A that simultaneously satisfies the condition (A2) and the condition (A3).

Hereinafter, a specific aspect of the GaN crystal in the first aspect will be described, but configurations, characteristics, applications, and the like of each requirement of the GaN crystal can be similarly applied to the GaN crystals in the second aspect and the third aspect.

The shape of the GaN crystal is not particularly limited, and may be an amorphous bulk shape, may be a plate shape, and in the case of the plate shape, a surface shape thereof may be, for example, a circular shape, and may be a polygonal shape such as a quadrangle, a hexagon, or an octagon. In addition, it is preferable that the GaN crystal be a GaN single crystal.

Hereinafter, a structure and characteristics will be described using a plate-shaped GaN crystal of which surface shape is circular, as an example, but the description thereof can also be applied to other shapes within an applicable range.

A thickness of the GaN crystal is not particularly limited, and may be 100 μm or more, 150 μm or more, 250 μm or more, 300 μm or more, 400 μm or more, 500 μm or more, 750 μm or more, 1 mm or more, 2 mm or more, or the like, and may be less than 5 mm, less than 2 mm, less than 1 mm, less than 750 μm, less than 500 μm, less than 400 μm, less than 300 μm, less than 250 μm, or the like. The thickness is not particularly limited, and is usually 20 mm or less. In a case where the GaN crystal has an amorphous bulk shape, it is preferable that a growth direction of the crystal satisfy these numerical ranges.

A diameter of a main surface of the GaN crystal is not particularly limited, and is preferably 45 mm or more, and can be 50 mm or more, 60 mm or more, 80 mm or more, or 100 mm or more in stages. Typically, the diameter is 45 to 55 mm (about 2 inches), 95 to 105 mm (about 4 inches), 145 to 155 mm (about 6 inches), 195 to 205 mm (about 8 inches), 295 to 305 mm (about 12 inches), and the like. In a case where the surface shape of the GaN crystal is a plate shape that is not circular, it is preferable that a maximum length that can be taken on the surface satisfy these numerical ranges, and it is preferable that a minimum length that can be taken on the surface satisfy these numerical ranges. In addition, in a case where the GaN crystal has an amorphous bulk shape, it is preferable that a maximum length that can be taken in a cross-section perpendicular to the growth direction of the crystal satisfy these numerical ranges.

A surface area of the main surface of the GaN crystal is not particularly limited, and is preferably 15 cm$^2$ or more, and may be 15 cm$^2$ or more and less than 50 cm$^2$, 50 cm$^2$ or more and less than 100 cm$^2$, 100 cm$^2$ or more and less than 200 cm$^2$, 200 cm$^2$ or more and less than 350 cm$^2$, 350 cm$^2$ or more and less than 500 cm$^2$, 500 cm$^2$ or more and less than 750 cm$^2$, or the like. In a case where the GaN crystal has an amorphous bulk shape, it is preferable that a maximum area, that can be taken, of a cross-section perpendicular to the growth direction of the crystal satisfy these numerical ranges.

The aspect of the crystal of the main surface of the GaN crystal is not particularly limited, and may be, for example, a c-plane, an a-plane, or an m-plane, but is particularly preferably a c-plane.

The concentration of an element contained as an impurity in a GaN crystal is generally measured by secondary ion mass spectrometry (SIMS).

The concentration of hydrogen (H) in the GaN crystal is preferably 2×10$^{19}$ atoms/cm$^3$ or less, more preferably 1×10$^{19}$ atoms/cm$^3$ or less, still more preferably 5×10$^{18}$ atoms/cm$^3$ or less, and particularly preferably 1×10$^{18}$ atoms/cm$^3$ or less. In addition, since the GaN crystal of the present embodiment is grown by the ammonothermal method, hydrogen (H) is contained at a concentration of 1×10$^{17}$ atoms/cm$^3$ or more. Also, the concentration of oxygen (O) in the GaN crystal is preferably 2×10$^{19}$ atoms/cm$^3$ or less, more preferably 1×10$^{19}$ atoms/cm$^3$ or less, still more preferably 5×10$^{18}$ atoms/cm$^3$ or less, and particularly preferably 1×10$^{18}$ atoms/cm$^3$ or less. Further, since the GaN crystal of the present embodiment is grown by the ammonothermal method, H (hydrogen) is contained at a concentration of 1×10$^{17}$ atoms/cm$^3$ or more and O (oxygen) at a concentration of 1×10$^{17}$ atoms/cm$^3$ or more.

In addition, the GaN crystal of the present embodiment may contain a halogen element in the crystal. The halogen element can be introduced by, for example, a mineralizer used in an ammonothermal method. Preferred examples of the halogen element which may be contained includes fluorine (F).

In a case where a GaN crystal is grown by an ammonothermal method using a mineralizer containing F, F may be contained at a concentration of 1×10$^{15}$ atoms/cm$^3$ or more, and is preferably contained at a concentration of 1×10$^{18}$ atoms/cm$^3$ or less, more preferably 5×10$^{17}$ atoms/cm$^3$ or less, and still more preferably 1×10$^{17}$ atoms/cm$^3$ or less.

Examples of the halogen element other than fluorine that may be contained in the GaN crystal include chlorine (Cl), bromine (Br), and iodine (I), and it is preferable that the halogen element substantially contained in the GaN crystal is only fluorine. Such crystals are obtained, for example, by using only a mineralizer containing F as a halogen.

An example of a preferred aspect of the GaN crystal of the present embodiment is as follows. A gallium nitride crystal which contains a halogen element in the crystal and in which the halogen element substantially contained is only fluorine, the gallium nitride crystal including a main surface 1 having an inclination of 0 degrees or more and 10 degrees or less from a (000-1) crystal plane, in which the main surface 1 is a specific main surface A satisfying at least one of the following conditions (A1) to (A3).

(A1) A first line segment which is a virtual line segment extending in a first direction on the specific main surface A and having a length of 40 mm and a second line segment which is a virtual line segment extending in a second direction perpendicular to the first direction on the specific main surface A and having a length of 40 mm can be drawn, and a facet growth region density in a random square region of 10 mm×10 mm on the specific main surface A does not exceed 500 cm$^{-2}$, and preferably does not exceed 100 cm$^{-2}$.

(A2) A first line segment which is a virtual line segment extending in a first direction on the specific main surface A and having a length of 40 mm and a second line segment which is a virtual line segment extending in a second direction perpendicular to the first direction on the specific main surface A and having a length of 40 mm can be drawn, and at least one square region of 20 mm×20 mm having a facet growth region density of less than 5 cm$^{-2}$ is found in the specific main surface A.

(A3) A first line segment which is a virtual line segment extending in a first direction on the specific main surface A and having a length of 40 mm and a second line segment which is a virtual line segment extending in a second direction perpendicular to the first direction on the specific main surface A and having a length of 40 mm can be drawn, and a ratio of a total area of facet growth regions to an area of the specific main surface A (total area of facet growth regions/area of specific main surface A) is 40% or less, and preferably 10% or less.

In the present specification, the fact that the halogen element substantially contained in the GaN crystal is only fluorine means that the total content of halogen elements other than F in the crystal is 1/100 or less of the content of F. When the total content of the halogen elements other than F in the crystal is within the above range, a member (for example, a lining material) used for a reaction vessel is hardly corroded. From the same viewpoint, the total content of halogen elements other than F in the crystal is more preferably 1/150 or less, and still more preferably 1/200 or less of the content of F.

Other examples of a preferred aspect of the GaN crystal of the present embodiment include the followings. A gallium nitride crystal which contains F in the crystal and in which a total content of halogen elements other than F is 1/100 or less of a content of F, the gallium nitride crystal including a main surface 1 having an inclination of 0 degrees or more and 10 degrees or less from a (000-1) crystal plane, in which the main surface 1 is a specific main surface A satisfying at least one of the following conditions (A1) to (A3).

(A1) A first line segment which is a virtual line segment extending in a first direction on the specific main surface A and having a length of 40 mm and a second line segment which is a virtual line segment extending in a second direction perpendicular to the first direction on the specific main surface A and having a length of 40 mm can be drawn, and a facet growth region density in a random square region of 10 mm×10 mm on the specific main surface A does not exceed 500 cm$^{-2}$, and preferably does not exceed 100 cm$^{-2}$.

(A2) A first line segment which is a virtual line segment extending in a first direction on the specific main surface A and having a length of 40 mm and a second line segment which is a virtual line segment extending in a second direction perpendicular to the first direction on the specific main surface A and having a length of 40 mm can be drawn, and at least one square region of 20 mm×20 mm having a facet growth region density of less than 5 cm$^{-2}$ is found in the specific main surface A.

(A3) A first line segment which is a virtual line segment extending in a first direction on the specific main surface A and having a length of 40 mm and a second line segment which is a virtual line segment extending in a second direction perpendicular to the first direction on the specific main surface A and having a length of 40 mm can be drawn, and a ratio of a total area of facet growth regions to an area of the specific main surface A (total area of facet growth regions/area of specific main surface A) is 40% or less, and preferably 10% or less.

Preferably, since the crystal is grown by an ammonothermal method without using a compound containing an alkali metal as a mineralizer, concentrations of lithium (Li), sodium (Na), and potassium (K) may be less than $1×10^{15}$ atoms/cm$^3$, respectively. In addition, it is possible to achieve the Fe concentration in the level of $10^{15}$ atoms/cm$^3$ or less than the level, and the Ni concentration in the level of $10^{15}$ atoms/cm$^3$ or less than the level.

The dislocation density as an index of a density of linear defects in the GaN crystal is not particularly limited, and is preferably $1×10^6$ cm$^{-2}$ or less, more preferably $5×10^5$ cm$^{-2}$ or less, still more preferably $1×10^5$ cm$^{-2}$ or less, and usually $1×10^2$ cm$^{-2}$ or more. In a case where a GaN crystal is grown by the HVPE method, the dislocation density of the GaN crystal is usually $10^6$ cm$^{-2}$ or more.

In the GaN crystal, it is preferable that a facet growth region having a diameter of 2 mm or more does not exist in the specific main surface A, and it is more preferable that a facet growth region having a diameter of 1.5 mm or more does not exist therein.

In the GaN crystal, it is required that a first line segment which is a virtual line segment extending in a first direction on the specific main surface A and having a length of 40 mm and a second line segment which is a virtual line segment extending in a second direction perpendicular to the first direction on the specific main surface A and having a length of 40 mm can be drawn.

It is preferable that the specific main surface A further satisfy at least one of the following conditions (B1) and (B2).

(B1) A maximum value of FWHM of an XRC among all measurement points is less than 40 arcsec when an XRC of 002 reflection is measured at an interval of 5 mm on the first line segment with an X-ray incident surface during each ω-scan parallel to the first line segment.

(B2) A difference between a maximum value and a minimum value of a peak angle of an XRC among all measurement points is less than 0.2° when an XRC of 002 reflection is measured at an interval of 5 mm on the first line segment with an X-ray incident surface during each ω-scan parallel to the first line segment.

The XRC is an X-ray rocking curve (or X-ray diffraction rocking curve), and the full width at half maximum (FWHM) thereof is an index generally used for quality evaluation of crystals.

A difference between the maximum value and the minimum value of a peak angle of the XRC in the condition (B2) simply indicates how much the c-axis direction in the GaN single crystal changes on the first line segment.

At least one of the first line segments that can be drawn on the main surface of the GaN single crystal according to the first embodiment desirably passes through the center (center of gravity) of the main surface, but is not limited thereto.

In the condition (B1), the maximum value of the FWHM is preferably less than 30 arcsec, and more preferably less than 20 arcsec.

In the condition (B2), the difference between the maximum value and the minimum value of the peak angle of the XRC among all the measurement points is preferably less than 0.1°, and more preferably less than 0.05°.

A radius of curvature of the GaN crystal in the a-axis direction is preferably 5 m or more, more preferably 10 m or more, still more preferably 20 m or more, and particularly preferably 30 m or more. The larger the radius of curvature is, the flatter the crystal lattice is arranged, and it can be said that the crystal is a high-quality crystal without defects such as dislocations or cracks.

The GaN crystal grown by the ammonothermal method may have a peak at 3140 to 3200 $cm^{-1}$ in the infrared absorption spectrum.

A second embodiment of the present invention relates to a gallium nitride (GaN) crystal.

An aspect of the GaN crystal according to the second embodiment of the present invention is a gallium nitride crystal including: a main surface 1 having an inclination of 0 degrees or more and 10 degrees or less from a (000-1) crystal plane; and a main surface 2, having an inclination of 0 degrees or more and 10 degrees or less from a (0001) crystal plane which is a main surface on an opposite side, in which a thickness in a c-axis direction is 1 mm or more, and an area ratio between a main area 1 and a main area 2 (main area 1/main area 2) is 0.5 or more and 1 or less.

An area ratio between the main area 1 and the main area 2 (main area 1/main area 2) is preferably 0.6 or more, more preferably 0.7 or more, and still more preferably 0.8 or more. As the area ratio between the main area 1 and the main area 2 is closer to 1, it becomes easier to obtain a GaN substrate having a larger area from a GaN crystal, and the productivity of a GaN substrate is improved.

An aspect of the GaN crystal according to the second embodiment of the present invention is a gallium nitride crystal including: a main surface 1 having an inclination of 0 degrees or more and 10 degrees or less from a (000-1) crystal plane; and a main surface 2, having an inclination of 0 degrees or more and 10 degrees or less from a (0001) crystal plane which is a main surface on an opposite side, in which a thickness in a c-axis direction is 1 mm or more, and an area ratio between a (10-1-1) plane and a (10-1-2) plane satisfies the following relational expression (C).

$$\text{Area of}(10\text{-}1\text{-}2)\text{plane}/\{\text{area of}(10\text{-}1\text{-}1)\text{plane}+\text{area of}(10\text{-}1\text{-}2)\text{plane}\}<0.5 \quad\quad (C)$$

The area ratio (that is, the right side of the expression (C)) between the (10-1-1) plane and the (10-1-2) plane is preferably less than 0.4, more preferably 0.3 or less, and still more preferably less than 0.3. As a ratio of the (10-1-2) plane to the sum of the (10-1-1) plane and the (10-1-2) plane is smaller, a GaN crystal having a larger area of the nitrogen polar surface is prone to be obtained, and the productivity of the GaN substrate is improved.

Other specific aspects of the GaN crystal according to the second embodiment of the present invention can apply the same as those of the GaN crystal according to the first embodiment.

<Method for Producing Gallium Nitride Crystal>

A third embodiment of the present invention relates to a method for producing a GaN crystal. The method for producing GaN single crystal according to the third embodiment can be used, for example, for producing the GaN crystals according to the first and second embodiments described above.

The method for producing a GaN crystal of the present embodiment includes at least: a seed preparation step of preparing a GaN seed which is obtained by a liquid phase growth method and has a nitrogen polar surface; and a crystal growth step of growing a GaN crystal on the nitrogen polar surface of the GaN seed by an ammonothermal method, at a growth temperature of 600° C. or higher, by setting a pressure in a reaction vessel containing a mineralizer containing fluorine to 200 MPa or less.

Seed Preparation Step

The present step is a step of preparing a GaN seed having a nitrogen polar surface obtained by a liquid phase growth method.

A typical example of the GaN seed is a C-plane GaN substrate. In the C-plane GaN substrate, a main surface on a [0001] side is a gallium polar surface, and a main surface on a [000-1] side is a nitrogen polar surface.

The GaN seed prepared in the present step is obtained by a liquid phase growth method. As the liquid phase growth method, a known method can be adopted, and an ammonothermal method, a Na flux method, and the like can be exemplified. Among these, a GaN seed obtained by an ammonothermal method is preferable, and a GaN seed obtained by an acidic ammonothermal method is particularly preferable. The present inventors have found that a GaN crystal in which generation of specific crystal defects is curbed can be obtained by using a GaN seed obtained by a liquid phase growth method as a seed crystal and satisfying crystal growth conditions to be described later. The detailed reason for this is not clear yet, but is presumed as follows. That is, it is considered that the facet growth region is generated by a defect or the like on a GaN seed surface used for growth serving as a starting point of facet growth. Since the GaN seed obtained by the liquid phase growth method has a lower dislocation density and fewer defects such as stress concentration portions caused by dislocations than those of the GaN seed obtained by, for example, a vapor phase growth method, it is considered that there are few defects that can serve as starting points of facet growth and occurrence of facet growth regions is curbed.

It is desirable that a surface (growth surface) of the GaN seed for crystal growth on the GaN seed have fewer defects that can serve as starting points of facet growth. From the viewpoint, the dislocation density of the growth surface of the GaN seed is preferably less than $1\times10^{7}$ $cm^{-2}$, more preferably $5\times10^{6}$ $cm^{-2}$ or less, still more preferably $1\times10^{6}$ $cm^{-2}$ or less, and still further preferably $5\times10^{5}$ $cm^{-2}$ or less. A lower dislocation density is more desirable, but a lower limit thereof is usually $1\times10^{2}$ $cm^{-2}$ or more.

It is desirable that a surface (growth surface) of the GaN seed for crystal growth on the GaN seed have fewer defects that can serve as starting points of facet growth. From the viewpoint, it is also preferable that a dislocation concentration region in which dislocations are relatively concentrated does not exist on the growth surface of the GaN seed. The dislocation concentration region may be intentionally formed. For example, in a case of trying to reduce dislocation by intentionally concentrating dislocations by forming a specific mask pattern in order to reduce dislocations on the entire crystal surface, a dislocation concentration region where dislocations are locally concentrated may remain on the crystal surface. When the dislocation concentration region exists, local stress is generated, and the dislocation concentration region can serve as a starting point of facet growth.

Specific examples of the surface (growth surface) of the GaN seed for crystal growth on the GaN seed described above include a nitrogen polar surface of the GaN seed.

An orientation of the nitrogen polar surface of the GaN seed is preferably within 2° from [000-1], expressed in the direction of the normal vector. This means that an angle formed by the normal vector of the nitrogen polar surface with [000-1] is within 2°. The orientation of the nitrogen polar surface of the GaN seed is more preferably within 1° from [000-1].

An area of the nitrogen polar surface of the GaN seed may be 15 cm$^2$ or more and less than 50 cm$^2$, 50 cm$^2$ or more and less than 100 cm$^2$, 100 cm$^2$ or more and less than 200 cm$^2$, 200 cm$^2$ or more and less than 350 cm$^2$, 350 cm$^2$ or more and less than 500 cm$^2$, 500 cm$^2$ or more and less than 750 cm$^2$, or the like.

When the nitrogen polar surface of the GaN seed is circular, a diameter thereof is usually 45 mm or more and 305 mm or less. The diameter is preferably 45 mm or more, and can be 50 mm or more, 60 mm or more, 80 mm or more, or 100 mm or more in stages. Typically, the diameter is 45 to 55 mm (about 2 inches), 95 to 105 mm (about 4 inches), 145 to 155 mm (about 6 inches), 195 to 205 mm (about 8 inches), 295 to 305 mm (about 12 inches), and the like.

For example, in a case where the GaN seed is a C-plane GaN substrate having a diameter of 50 mm, a thickness thereof is preferably 300 μm or more, and if the diameter is larger than this, a preferable lower limit value of the thickness becomes also larger. The thickness of the GaN seed is not particularly limited, but is usually 20 mm or less.

A size of the GaN seed is determined in consideration of a size of the GaN crystal to be grown in a subsequent crystal growth step.

For example, in a case where a C-plane GaN substrate having a size of 45 mm in each of a [1-100] direction, a [10-10] direction, and a [01-10] direction is to be cut out from a GaN crystal to be grown, it is necessary to grow the GaN crystal so that the size thereof in each of the [1-100] direction, the [10-10] direction, and the [01-10] direction is 45 mm or more. In order to grow a GaN crystal having a size of 45 mm in each of the [1-100] direction, the [10-10] direction, and the [01-10] direction, it is preferable to use a GaN seed having a size of 45 mm or more in each of the [1-100] direction, the [10-10] direction, and the [01-10] direction.

The nitrogen polar surface of the GaN seed is usually planarized by polishing or grinding. Preferably, a damaged layer introduced by planarization processing is removed from the nitrogen polar surface by chemical mechanical polishing (CMP) and/or etching.

The dislocation density of the GaN seed is not particularly limited, and is preferably 1×10$^6$ cm$^{-2}$ or less, more preferably 5×10$^5$ cm$^{-2}$ or less, still more preferably 1×10$^5$ cm$^{-2}$ or less, and usually 1×10$^2$ cm$^{-2}$ or more.

Crystal Growth Step

This step is a step of growing a GaN crystal on a nitrogen polar surface of a GaN seed by an ammonothermal method, specifically, growing a GaN crystal on the nitrogen polar surface of the GaN seed by an ammonothermal method by setting a pressure in a reaction vessel containing a mineralizer containing fluorine to 200 MPa or less and a growth temperature to 600° ° C. or higher.

Examples of a preferred embodiment include a step of growing a GaN crystal on a surface of the GaN seed, in a reaction vessel containing a GaN seed having a nitrogen polar surface obtained by a liquid phase growth method, a nitrogen-containing solvent, a raw material, and a mineralizer, by controlling the nitrogen-containing solvent to be in a supercritical state and/or a subcritical state.

The present inventors have found that a GaN crystal in which generation of specific crystal defects is curbed can be obtained by using the GaN seed described above and satisfying the crystal growth conditions. The detailed reason for this is not clear yet, but is presumed as follows. It is considered that, in the formation of the facet growth region on the nitrogen polar surface of the GaN crystal, since a crystal growth rate in the facet plane direction is relatively slow as compared with a crystal growth rate in a (000-1) plane direction, the facet growth region continues to exist without being completely filled. Specifically, it is considered that the growth rate of a facet plane represented by a (10-1-1) plane or a (10-1-2) plane is slower than the growth rate of a (000-1) plane. The present inventors have found that the growth rate in a specific facet plane direction can be improved by setting the pressure in the reaction vessel to 200 MPa or less and setting the temperature of the crystal growth region to 600° C. or higher, which is a higher temperature as compared with the conventional method. As a result, it is considered that the relative difference in crystal growth rate between the (000-1) plane direction and the facet plane direction decreases, and the formation of the facet growth region can be curbed. It is presumed that the facet growth region density can be greatly improved by a synergistic effect obtained by combining with the suppression effect obtained by adopting the GaN seed obtained by the liquid phase growth method described above. In addition, as will be described later, it is also possible to effectively reduce the facet growth region density by reducing foreign matter externally adhering to the growth surface of the GaN seed.

Furthermore, the present inventors have found that a GaN crystal in which an area ratio between the main surface 1 and the main surface 2 (main surface 1/main surface 2) is large can be obtained by using the GaN seed described above and satisfying the crystal growth conditions. The detailed reason for this is not clear yet, but is presumed as follows. It is considered that, in the conventional method, since a growth rate of a facet plane (for example, a (10-1-2) surface) having a gentler inclination with respect to the c-axis direction among facet planes formed around the main surface is slower than a growth rate of a facet plane (for example, a (10-1-1) surface) having a steeper inclination with respect to the c-axis direction, an area of the facet plane having the gentler inclination is enlarged, and accordingly, an area of the main surface (main surface 1) on the nitrogen polar surface side is reduced. According to the method of the present disclosure, it is considered that since the crystal growth rate in the specific facet plane direction can be improved as described above, the enlargement of the area of the specific facet plane can be curbed and the reduction of the area of the main surface 1 can be curbed. As a result, it is presumed that a GaN crystal having a larger area ratio between the main surface 1 and the main surface 2 (main surface 1/main surface 2) than in the conventional method can be obtained.

Hereinafter, the crystal growth step will be described in detail.

(Mineralizer)

The mineralizer is not particularly limited as long as it is a mineralizer containing fluorine. Examples of the mineralizer containing fluorine include ammonium fluoride, hydrogen fluoride, and hydrocarbylammonium fluoride, alkyl ammonium salts such as tetramethylammonium fluoride, tetraethylammonium fluoride, benzyltrimethylammonium fluoride, dipropylammonium fluoride, and isopropylammonium fluoride, an alkyl metal fluoride such as an alkyl sodium fluoride, an alkaline earth metal fluoride, and a metal fluoride. Among these, an alkyl metal fluoride, a fluoride of alkaline earth metal, a metal fluoride, ammonium fluoride, and hydrogen fluoride are preferable, an alkyl metal fluoride, ammonium fluoride, and a fluoride of group 13 metal of the periodic table are more preferable, and ammonium fluoride ($NH_4F$) and gallium fluoride are particularly preferable. By using a mineralizer containing fluorine, a high-quality crystal with good crystallinity tends to be obtained. More preferably, a mineralizer containing only fluorine as a halogen element is used.

As the mineralizer, only a mineralizer containing fluorine may be used, or a mixture of a mineralizer containing fluorine and a mineralizer not containing fluorine may be used. Examples of the mineralizer not containing fluorine include an acidic mineralizer composed of a halogen other than fluorine and an ammonium ion, such as ammonium chloride, ammonium iodide, or ammonium bromide,; a neutral mineralizer composed of an alkali metal, and a halogen, such as lithium chloride, lithium bromide, lithium iodide, sodium chloride, sodium bromide, sodium iodide, potassium chloride, potassium bromide, or potassium iodide; a neutral mineralizer composed of an alkaline earth metal and a halogen, such as beryllium chloride, beryllium bromide, beryllium iodide, magnesium chloride, magnesium bromide, magnesium iodide, calcium chloride, calcium bromide, or calcium iodide; and a basic mineralizer such as alkaline earth metal amides, rare earth amides, alkali metal nitrides, alkaline earth metal nitrides, azide compounds, and other salts of hydrazines. In a case where a mineralizer containing fluorine and a mineralizer not containing fluorine are used, a proportion of the mineralizer containing fluorine to the total mineralizer is preferably 50 mol % or more, more preferably 60 mol % or more, and still more preferably 80 mol % or more. As the mineralizer not containing fluorine, it is preferable to use a mineralizer containing a halogen other than fluorine from the viewpoint of controlling the shape of a growing crystal using the orientation dependence of the growth rate by the mineralizer and controlling the deposition of miscellaneous crystals. In this case, it is preferable that 50% or more of the total halogen in the mineralizer be fluorine, it is more preferable that 60% or more thereof be fluorine, and it is still more preferable that 80% or more thereof be fluorine.

It is preferable that the mineralizer exhibit negative solubility characteristics in the nitrogen-containing solvent in the vicinity of the temperature at which the GaN crystal is grown. For example, ammonium fluoride exhibits negative solubility characteristics in ammonia in a temperature range of 400° C. or higher. Usually, since it is preferable to set the temperature of the crystal growth region to 450° ° C. or higher, in a case where only ammonium fluoride is used as the mineralizer, ammonium fluoride exhibits negative solubility characteristics at the crystal growth temperature. On the other hand, in a case of being used in combination with ammonium chloride or the like exhibiting positive solubility characteristics at the temperature, the slope of the solubility curve determined based on each solubility characteristic varies depending on a mixing ratio. When an absolute value of the slope of the solubility curve is small, the efficiency of crystal growth is deteriorated, and thus the mixing ratio is adjusted so that a solubility curve with an appropriate slope is shown.

The molar concentration of fluorine contained in the mineralizer with respect to the nitrogen-containing solvent is preferably 0.2 mol % or more, more preferably 0.27 mol % or more, still more preferably 1.0 mol % or more, and particularly preferably 1.5 mol % or more, and is preferably 30 mol % or less, more preferably 20 mol % or less, still more preferably 10 mol % or less, and particularly preferably 2 mol % or less. When the concentration is high, the solubility of the raw material in the nitrogen-containing solvent is improved, and the growth rate tends to increase, which is preferable. On the other hand, when the concentration is low, since the solubility can be appropriately maintained, spontaneous nucleation can be curbed, and the degree of supersaturation can be kept small, so that control is facilitated, which is preferable.

(Pressure)

From the viewpoint of suppressing the generation of defects in the GaN crystal, the crystal is grown by setting the pressure in the reaction vessel during crystal growth to 200 MPa or less. The pressure in the reaction vessel is preferably 5 MPa or more, more preferably 10 MPa or more, still more preferably 12 MPa or more, particularly preferably 15 MPa or more, and most preferably 20 MPa or more, and is preferably 150 MPa or less, more preferably 120 MPa or less, and still more preferably 100 MPa or less. The production method of the present embodiment is characterized in that a GaN crystal can be efficiently grown even under a relatively low pressure. When the crystal is grown at a relatively low pressure, a thickness of the pressure-resistant container can be reduced, and the energy efficiency can also be increased, thereby curbing the costs.

(Gan Seed)

As the GaN seed used in the crystal growth step, the GaN seed prepared in the above-described GaN seed preparation step can be used.

(Nitrogen-Containing Solvent)

As a solvent, a nitrogen-containing solvent is used.

Examples of the nitrogen-containing solvent include solvents that do not impair the stability of the GaN crystal to be grown. Examples of the solvent include ammonia, hydrazine, urea, amines (for example, a primary amine such as methylamine, a secondary amine such as dimethylamine, a tertiary amine such as trimethylamine, or a diamine such as ethylenediamine), and melamine. These solvents may be used alone or used in combination.

The amount of water or oxygen contained in the solvent is desirably as small as possible, and a content thereof is preferably 1000 ppm or less, more preferably 10 ppm or less, and still more preferably 0.1 ppm or less. In a case where ammonia is used as a solvent, the purity thereof is usually 99.9% or more, preferably 99.99% or more, and still more preferably 99.999% or more.

(Raw Material)

As the raw material, a raw material containing an element constituting a GaN crystal to be grown on a seed crystal is used. It is preferably a polycrystalline raw material of GaN crystals and/or a metal to be nitrided, and more preferably gallium nitride and/or metal gallium. The polycrystalline raw material does not need to be a complete nitride, and may contain a metal component in which a group 13 element of the periodic table is in a metal state (0 valent) depending on conditions, for example, in a case where the crystal is gallium nitride, a mixture of gallium nitride and metal gallium can be exemplified.

A method for producing the polycrystalline raw material is not particularly limited. For example, a nitride polycrystal produced by reacting a metal or an oxide or hydroxide thereof with ammonia in a reaction vessel through which an ammonia gas flows can be used. In addition, as a metal compound raw material having higher reactivity, a compound having a covalent M-N bond such as a halide, an amide compound, an imide compound, or galazan can be used. Furthermore, a nitride polycrystal produced by reacting a metal such as Ga with nitrogen at high temperature and high pressure can also be used.

It is preferable that the amount of water or oxygen contained in the polycrystalline raw material used as a raw material be small. The oxygen content in the polycrystalline raw material is usually 10000 ppm or less, preferably 1000 ppm or less, and particularly preferably 1 ppm or less. The ease of incorporating oxygen into the polycrystalline raw material is related to reactivity with moisture or absorption capacity. As the crystallinity of the polycrystalline raw material is worse, more active groups such as NH groups are present on the surface, and there is a possibility that the active groups react with water to partially form oxides and hydroxides. Therefore, it is usually preferable to use a polycrystalline raw material having as high crystallinity as possible. The crystallinity can be estimated by a half-value width of powder X-ray diffraction, and the half-value width of the diffraction line of (100) (2θ=about 32.5° in hexagonal gallium nitride) is usually 0.25° or less, preferably 0.20° or less, and still more preferably 0.17° or less.

(Reaction Vessel)

The growth reaction of the GaN crystal is performed in a reaction vessel. The reaction vessel means a container which is used for producing a GaN crystal in a state in which a nitrogen-containing solvent in a supercritical state and/or a subcritical state can be in direct contact with an inner wall surface thereof, and preferred examples thereof include a structure itself inside the pressure-resistant container and a capsule installed in the pressure-resistant container.

A pressure-resistant portion of the reaction vessel is preferably made of any one of a Ni-based alloy, an Fe-based alloy, and a cobalt-based alloy, or an alloy obtained by combining these alloys, and is particularly preferably made of a Ni—Fe-based alloy (it is particularly preferable that the Ni—Fe-based alloy have an Fe content of 30 to 40 mass %, and contain Cr, Ti, Al, and Nb as other elements).

A mode in which the reaction vessel is made using these alloys is not particularly limited. The inner surface of the pressure-resistant portion may be directly lined or coated with a material excellent in corrosion resistance to form a reaction vessel, or a capsule made of a material excellent in corrosion resistance may be disposed in the pressure-resistant container.

A shape of the reaction vessel may be any shape such as a cylindrical shape. In addition, the reaction vessel may be installed upright, horizontally, or obliquely, and it is particularly preferable to use the reaction vessel in an upright state.

A platinum group or a platinum group alloy can be used for a lining material or a capsule as the corrosion-resistant portion. Examples of the platinum group include Pt, Au, Ir, Ru, Rh, Pd, and Ag. In the production method of the present embodiment, Ag or an alloy containing Ag can be suitably used as the lining material by using a compound containing fluorine as the mineralizer alone.

(Crystal Growth)

In the reaction vessel containing the GaN seed prepared in the seed preparation step, a nitrogen-containing solvent, a raw material, and a mineralizer, a GaN crystal on a surface of the GaN seed (seed crystal) is grown by controlling a solvent to be in a supercritical state and/or a subcritical state. The pressure conditions in this case are as described above.

The temperature at the time of growth is set to temperatures different between the raw material dissolution region in which the raw material dissolves and the crystal growth region in which the crystal is grown on the seed crystal. In the method of the present embodiment, it is required that the temperature of the crystal growth region be 600° C. or higher. The temperature is more preferably 610° C. or higher. In addition, the temperature of the crystal growth region may be higher, and can be preferably set to, for example, 700° C. or lower, or 650° C. or lower. The temperature of the raw material dissolution region is set to be higher than the temperature of the crystal growth region in a case where a mineralizer having negative solubility characteristics is used. In addition, in a case where a mineralizer having positive solubility characteristics is used, the temperature is set to be lower than the temperature of the crystal growth region. The temperature difference between the raw material dissolution region and the crystal growth region is usually set to 30° C. or higher and preferably 40° C. or higher, and is usually set to 150° C. or lower and preferably 120° C. or lower.

At an initial stage of crystal growth, it is also preferable to etch the surface of the GaN seed by adjusting the solubility. As a result, a surface layer portion of the GaN seed dissolves, and a damaged layer that can serve as a starting point of facet growth can be removed.

By growing the GaN crystal under the conditions described above, the crystal can be grown at a relatively high growth rate. By optimizing the conditions, the crystal growth rate can be 300 μm/day or higher, 500 μm/day or higher, 700 μm/day or higher, or 900 μm/day or higher. In addition, even in the case of performing at a low temperature and a low pressure, it is possible to realize the growth rate faster than in the conventional method.

(Preparation Step)

In addition to the above growth step, a preparation step of putting a nitrogen-containing solvent and a raw material into a reaction vessel in addition to the GaN seed may be included before the above growth step. The method for putting these materials into the reaction vessel is not particularly limited, and examples thereof include a method in which a seed crystal is placed in a lower part of the reaction vessel, a raw material is placed in an upper part of the reaction vessel, and then a nitrogen-containing solvent is poured.

It is desirable that a surface (growth surface) of the GaN seed for crystal growth on the GaN seed have fewer growth inhibiting factors that can serve as starting points of facet growth. Examples of the growth inhibiting factors that can serve as starting points of facet growth include, as described above, crystal defects such as dislocations inherent in GaN seeds, and in addition, foreign matter externally adhering to the surface of the GaN seed can also be the growth inhibiting factors. Examples of such foreign matter include impurities present on an inner wall of the reaction vessel, and fine pieces of GaN polycrystal as a raw material. In order to avoid adhesion of foreign matter to the growth surface of the GaN seed, it is preferable that the direction of the growth surface of the GaN seed when the GaN seed is placed in the reaction vessel is parallel to the height direction of the reaction vessel or has a downward angle. In this case, it is possible to prevent foreign matter from externally adhering to the growth surface of the GaN seed, which is desirable from the viewpoint of suppressing facet growth.

In addition, similarly, from the viewpoint of preventing foreign matter from adhering to the growth surface of the GaN seed, it is also preferable to sufficiently clean the inner wall of the reaction vessel before the preparation step. This is desirable from the viewpoint of accordingly reducing foreign matter that may have adhered to the inner wall of the reaction vessel in advance, leading to prevention of foreign matter adhesion to the growth surface of the GaN seed, and suppressing facet growth. A cleaning method is not particularly limited, and for example, foreign matter adhering to the inner wall can be removed by physical cleaning with a brush or the like or chemical cleaning with an acid, an alkali, or the like.

(Degassing Step)

In addition to the growth step, in order to obtain GaN crystal with high purity, it is preferable to include a degassing step of heat degassing the inside of the reaction vessel before the growth step described above. By providing the degassing step, oxygen in the reaction vessel can be reduced, and the amount of oxygen impurities contained in the GaN crystal can be adjusted.

A method of heat degassing is not particularly limited, and the heat degassing can be performed by a known method, and examples thereof include a method of degassing with a vacuum pump while heating.

A temperature at the time of heat degassing is not particularly limited, and a temperature range is preferably 80° C. or higher, more preferably 120° C. or higher, still more preferably 160° C. or higher, and preferably 300° ° C. or lower, more preferably 280° C. or lower, and still more preferably 260° ° C. or lower.

The degree of vacuum at the time of heat degassing is preferably as high as possible, and is usually preferably $5\times10^{-4}$ Pa or less, more preferably $1\times10^{-4}$ Pa or less, and still more preferably $5\times10^{-5}$ Pa or less.

The longer the heating degassing time is, the higher the effect of reducing oxygen impurities is, which is preferable. However, the shorter the heat degassing time is, the higher the productivity and the lower the cost are. The heat degassing time is preferably 2 hours or more, more preferably 6 hours or more, further preferably 12 hours or more, preferably 72 hours or less, more preferably 48 hours or less, and particularly preferably 24 hours or less.

(Processing Step)

In addition to the growth step, a processing step of processing a GaN crystal may be included after the growth step. As the processing, for example, it is conceivable to acquire only a portion having desired characteristics by slicing the obtained GaN crystal, and it is most preferable to acquire only a portion meeting the range of crystal quality requirements as described above. The GaN crystal thus obtained can be used as a GaN substrate to be described later.

<Gallium Nitride Substrate and Method for Producing Same>

Another embodiment of the present invention is a gallium nitride substrate (hereinafter, also referred to as a "GaN substrate") obtained by slicing the GaN crystal, and a method for producing the same.

A diameter of the GaN substrate is 50 mm or more, typically 50 to 55 mm (about 2 inches), 100 to 105 mm (about 4 inches), 150 to 155 mm (about 6 inches), and the like. Since the GaN substrate is required to have strength enough not to hinder handling, a thickness thereof is usually 250 µm or more, and can be further increased according to the diameter.

When the diameter of the GaN substrate is about 2 inches, the thickness is preferably 250 µm or more and more preferably 300 µm or more, and is preferably 450 µm or less and more preferably 400 µm or less.

When the diameter of the GaN substrate is about 4 inches, the thickness is preferably 350 µm or more, more preferably 400 µm or more, and preferably 750 µm or less, and more preferably 650 µm or less.

When the diameter of the GaN substrate is about 6 inches, the thickness is preferably 450 µm or more and more preferably 550 µm or more, and is preferably 800 µm or less and more preferably 700 µm or less.

The GaN substrate can be preferably used for producing a nitride semiconductor device.

In a process for producing the GaN semiconductor device, one or more kinds of nitride semiconductor layers are epitaxially grown on the main surface of the GaN substrate to form an epitaxial wafer. As an epitaxial growth method, a gas phase method such as metal organic vapor phase epitaxy (MOVPE), molecular beam epitaxy (MBE), pulsed excitation deposition (PXD), sputtering, or HVPE can be preferably used.

The nitride semiconductor layer to be epitaxially grown can be made n-type conductive, p-type conductive, or semi-insulating by doping.

The GaN seed used for the crystal growth is not particularly limited, and a known GaN seed may be used, and it is preferable to use the GaN substrate according to another embodiment of the present invention described above.

For the growth of the GaN crystal on the GaN seed by the ammonothermal method, the conditions of the growth in the above-described method for producing a GaN crystal can be applied.

A thickness of the GaN crystal grown on the GaN seed by the ammonothermal method is 500 µm or more, and is preferably 600 µm or more, 700 µm or more, 800 µm or more, or 900 µm or more.

As the conditions of the method for producing a GaN substrate, the above-described conditions of the GaN crystal and the GaN substrate can be applied within an applicable range.

Examples of the nitride semiconductor device that can be produced using the GaN substrate include light emitting devices such as a light emitting diode (LED) and a laser diode (LD), electronic devices such as a rectifier, a bipolar transistor, a field effect transistor, and a high electron mobility transistor (HEMT), semiconductor sensors such as a temperature sensor, a pressure sensor, a radiation sensor, and a visible-ultraviolet light detector, and a solar cell.

Other applications of the GaN substrate include a seed or the like when growing a bulk GaN crystal by HVPE, tri-halide vapor phase epitaxy (THVPE), oxide vapor phase epitaxy (OVPE), an ammonothermal method, a Na flux method, and various other methods.

EXAMPLES

Hereinafter, features of the present invention will be described more specifically with reference to Examples and Comparative Examples. Materials, amounts used, proportions, processing contents, processing procedures, and the like shown in the following Examples can be appropriately changed without departing from the gist of the present invention. Therefore, the scope of the present invention should not be restrictively interpreted by the following specific examples.

<Evaluation Method>

(1) Calculation of Facet Growth Region Density

Figure 3:
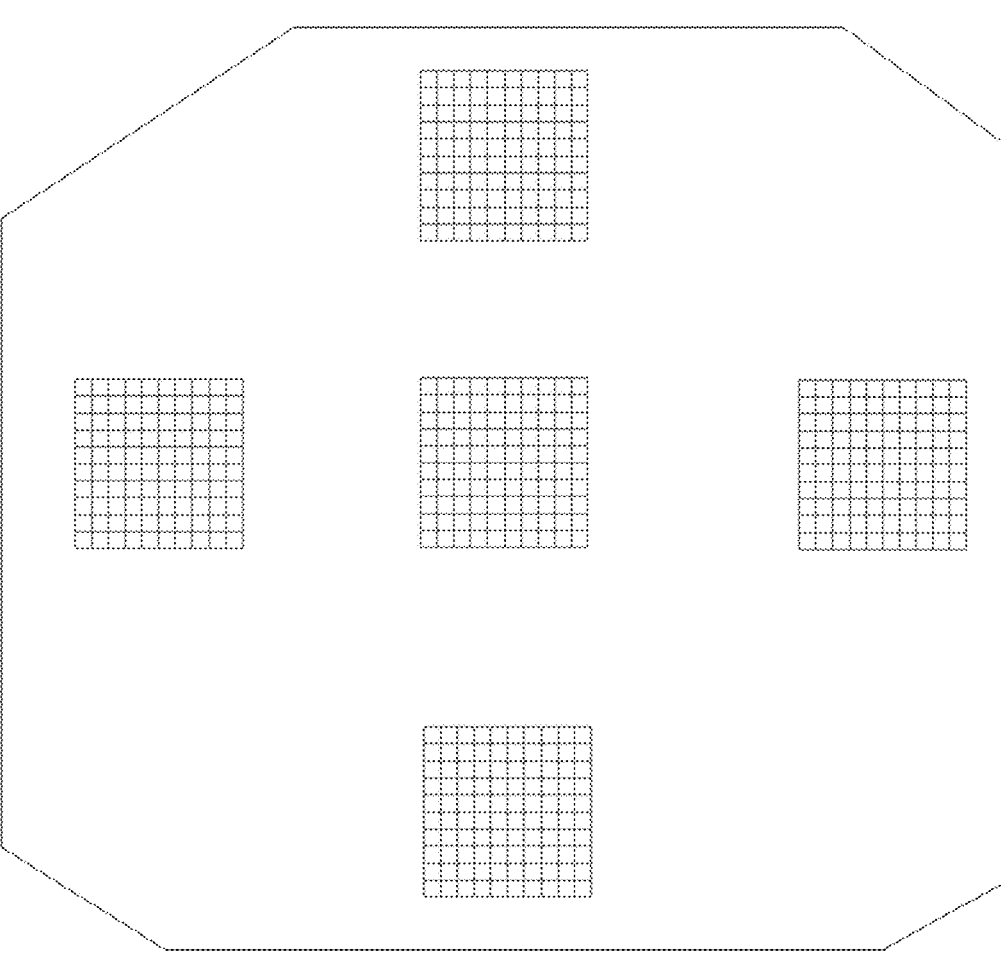
FIG. 3 is a schematic view illustrating an example of a method for calculating a facet growth region density in the present disclosure.

Observation was performed with a digital camera in a state where a nitrogen polar plane of a GaN crystal was grown. Since the facet growth region has a concave shape and has a diameter of 100 to several 100 μm, it can be easily observed with the naked eye. Observation may also be performed with a microscope, but since it is necessary to widely observe a region of 10 mm×10 mm or more, observation at a low magnification is suitable as much as possible. In counting the facet growth region, as illustrated in FIG. 3, regions of 10 mm×10 mm on the nitrogen polar plane are randomly taken, and the inside of the regions are further divided into regions of 1 mm×1 mm. By counting and summing the number of facet growth regions per 1 mm×1 mm region, a facet growth region density in a 10 mm×10 mm area can be obtained. In addition, regions of 20 mm×20 mm on the nitrogen polar plane are randomly taken, and the inside of the regions are further divided into regions of 1 mm×1 mm. The number of facet growth regions in each area was counted and summed to obtain the number of facet growth regions in a region of 20 mm×20 mm. Further, by dividing the area by 4 cm², a facet growth region density in a 20 mm×20 mm area was obtained.

(2) XRC Measurement

An X-ray rocking curve (XRC) of 002 reflection in the prepared C-plane GaN wafer was measured using an X-ray diffractometer [SmartLab manufactured by Rigaku Corporation] using CuKα as an X-ray source. A Ge(440) 4 crystal monochromator was used as an incident optical system of the X-ray diffractometer. A size of the longitudinal limiting slit of the X-ray beam was set to 2 mm.

In addition, in order to measure the in-plane off-angle distribution, measurement was performed by w-scan at an interval of 5 mm on a line segment Y parallel to an a-axis on the nitrogen polar plane. The radius of curvature was also calculated from Aw which is the variation in ω.

Example 1

Figure 1:
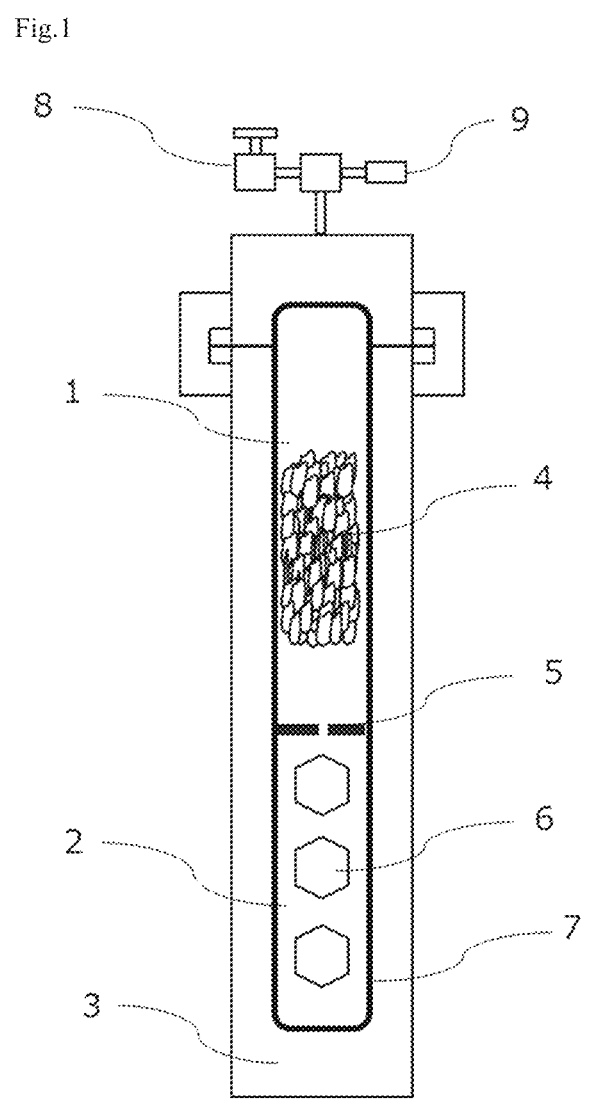

In this example, a GaN crystal was grown using a reactor shown in FIG. 1.

Crystal growth was performed using a Ni—Fe-based alloy autoclave (a ratio of volume to internal surface area: 2.3 (cm)) whose inner surface was lined with Ag as a pressure-resistant container. A filling operation into the container provided with an outer wall was performed in an air atmosphere. The inner wall of the pressure-resistant container was cleaned before the filling operation. In a cleaning method, the inner wall deposit was dissolved using a heated alkaline solution, and then the inner wall was cleaned by rubbing with a nylon sponge, and rinsed with pure water.

As a seed crystal, a hexagonal GaN single crystal (68 mm in m-axis direction×60 mm in a-axis direction×0.6 mm in c-axis direction) grown by an ammonothermal method was used. The (000-1) plane, which is a main plane of the seed crystal, was sliced with a wire saw and then etched with KOH. This present seed crystal 6 was hung on a molybdenum seed crystal support frame by a tungsten wire having a diameter of 0.2 mm, and installed in a crystal growth region

2 in an autoclave lower part. The (000-1) plane of the seed crystal was placed slightly downward. The dislocation density of the (000-1) plane of the seed crystal was in the level of 10⁴/cm² on average. In addition, a dislocation concentration region did not exist.

A baffle plate 5 made of molybdenum was placed between the crystal growth region 2 in a lower part and a raw material dissolution region 1 in an upper part. Further, 5800 g of polycrystalline GaN particles was weighed as the raw material 4 and placed in the autoclave upper region (raw material dissolution region 1). Next, $NH_4F$ with a purity of 99.9% and sufficiently dried as a mineralizer source was weighed so as to be 10 mol % with respect to ammonia to be filled, and was put into a pressure-resistant container.

Subsequently, a lid of the autoclave on which a valve 8 was mounted was closed. Then, a conduit was operated to lead to a vacuum pump via a valve 8 attached to the autoclave, and the valve 8 was opened for vacuum degassing. Thereafter, the autoclave was cooled with dry ice methanol solvent while maintaining a vacuum state, and the valve 8 was once closed. Subsequently, after the conduit was operated to lead to a $NH_3$ cylinder, the valve 8 was opened again to continuously fill the autoclave with $NH_3$ without being exposed to the outside air, and then the valve 8 was closed again. The temperature of the autoclave was returned to room temperature, an outer surface was sufficiently dried, and the weight of the autoclave was measured. The $NH_3$ filling amount was confirmed by a value of a mass flowmeter, and a filling rate was adjusted to 33%.

Subsequently, the autoclave was housed in an electric furnace configured of heaters divided into upper and lower two parts. The temperature was raised so that the temperature of the raw material dissolution region 1 on an outer surface of the autoclave was 588.5° C. and the temperature of the crystal growth region 2 was 617.4° C. (temperature difference: 28.9° C.), and after reaching the set temperature, the autoclave was kept at the temperature for 14 days. The pressure in the autoclave was 120 MPa. In addition, the variation of the autoclave outer surface control temperature during the maintaining was ±0.5° C. or less. In the initial stage of growth, the surface of the seed crystal was etched by adjusting the solubility, and the damaged layer was removed.

The extracted crystal had a thickness of 2.7 mm in the c-axis direction. A ratio of the area of the nitrogen polar plane to the area of the gallium polar plane (nitrogen polar plane/gallium polar plane) of the crystal was 0.76. The ratio of the area of the (10-1-2) plane to a total area of the (10-1-1) plane and the (10-1-2) plane was 0.22. The nitrogen polar plane was visually flat, and the facet growth region was extremely small. The XRC of the present crystal was measured, and the full width at half maximum (FWHM) was 19 arcsec by 002 reflection. The ω-scan measurement was performed at an interval of 5 mm on a line segment of 50 mm in the a-axis direction, and Δω was ±0.03°. The radius of curvature was calculated to be 50 m.

The number of facet growth regions on the nitrogen polar plane of the present crystal was counted. Five random measurement areas of 1 cm×1 cm were measured, and facet growth region densities were 2 cm⁻², 94 cm⁻², 2 cm⁻², 5 cm⁻², and 0 cm⁻², respectively. Further, an area of 2 mm×2 mm was selected, and the number of facet growth regions was counted, which was 18. A density calculated was 4.5 cm⁻².

The ratio of a total areas of the facet growth regions to the area of the main area 1 of the present crystal was 4%.

Comparative Example 1

Crystal growth was performed under exactly the same conditions as in Example 1 except that a GaN crystal (diameter of nitrogen polar plane as main surface: 50 mm, dimension in c-axis direction: 0.6 mm) grown by an HVPE method was used as a seed crystal. The dislocation density of the seed crystal was in the level of $10^6/cm^2$ on average. In addition, there was a dislocation concentration region.

The extracted crystal had a thickness of about 3 mm in the c-axis direction. The nitrogen polar plane had severe irregularities visually, and was in a state of being not possible to count the number of individual facet growth regions. The XRC of the present crystal was measured, and the full width at half maximum (FWHM) was 34 to 47 arcsec by 002 reflection. The ω-scan measurement was performed at an interval of 5 mm on a line segment of 40 mm in the a-axis direction, and Δω was +0.6°. The radius of curvature was calculated to be 3 m.

As described above, the facet growth region on the nitrogen polar plane of the present crystal was entirely facet grown, and it was not possible to count the density due to severe irregularities.

Comparative Example 2

The seed crystal was cut out from a crystal grown by an ammonothermal method and having exactly the same quality as that of Example 1, and a seed crystal having the same size as that of Example 1 was used. In growth conditions, only the temperature was changed as compared with Example 1, the temperature was raised so that the temperaplane had many planar areas visually, but many facet growth regions were observed. The XRC of the present crystal was measured, and the full width at half maximum (FWHM) was 18.5 arcsec by 002 reflection. The ω-scan measurement was performed at an interval of 5 mm on a line segment of 60 mm in the a-axis direction, and Δω was ±0.02°. The radius of curvature was calculated to be 240 m.

The number of facet growth regions on the nitrogen polar plane of the present crystal was counted. Five random measurement areas of 1 cm×1 cm were measured, and facet growth region densities were 15 $cm^{-2}$, 863 $cm^{-2}$, 497 $cm^{-2}$, 1280 $cm^{-2}$, and 787 $cm^{-2}$, respectively.

The ratio of a total areas of the facet growth regions to the area of the main area 1 of the present crystal was 42%.

Comparative Example 3

Crystal growth was performed under exactly the same conditions as in Comparative Example 2 except that a GaN crystal (diameter of nitrogen polar plane as main surface: 50 mm, dimension in c-axis direction: 0.6 mm) grown by an HVPE method was used as a seed crystal.

The extracted crystal had a thickness of about 3 mm in the c-axis direction. The nitrogen polar plane had severe irregularities visually, and was in a state of being not possible to count the number of individual facet growth regions. The XRC of the present crystal was measured, and the full width at half maximum (FWHM) was multipeak at 82 to 143 arcsec by 002 reflection. The ω-scan measurement was performed at an interval of 5 mm on a line segment of 40 mm in the a-axis direction, and Δω was ±0.8°. The radius of curvature was calculated to be 1 m.

As described above, the facet growth region on the nitrogen polar plane of the present crystal was entirely facet grown, and it was not possible to count the density due to severe irregularities.

TABLE 1

| | Method for growing GaN seed — | Pressure in reaction vessel (MPa) | Temperature of crystal growth region (C) | Maximum value of facet growth region density ($cm^{-2}$) | Area ratio of facet growth region (%) | FWHM of (002) reflection (arcsec) | Δω (°) | Radius of curvature in a-axis direction (m) |
|---|---|---|---|---|---|---|---|---|
| Example 1 | Ammonothermal method | 120 | 617° C. | 94 | 4 | 19 | ±0.03 | 50 |
| Comparative Example 1 | HVPE method | 120 | 617° C. | — ✕ | >50 | 34~47 | ±0.6 | 3 |
| Comparative Example 2 | Ammonothermal method | 110 | 593° C. | 1280 | 42 | 18 | ±0.02 | 240 |
| Comparative Example 3 | HVPE method | 110 | 593° C. | — ✕ | >50 | 82~143 | ±0.8 | 1 |

* Since this was entirely facet grown, it was not possible to count the density due to severe irregularities.

ture of the raw material dissolution region 1 on an outer surface of the autoclave was 555.8° C. and the temperature of the crystal growth region 2 was 593.0° C. (temperature difference: 37.2° C.), and after reaching the set temperature, the autoclave was kept at the temperature for 14 days. The pressure in the autoclave was 110 MPa. In addition, the variation of the autoclave outer surface control temperature during the maintaining was ±0.5° C. or less.

The extracted crystal had a thickness of 2.9 mm in the c-axis direction. A ratio of the area of the nitrogen polar plane to the area of the gallium polar plane (nitrogen polar plane/gallium polar plane) of the crystal was 0.46. The ratio of the area of the (10-1-2) plane to a total area of the (10-1-1) plane and the (10-1-2) plane was 0.56. The nitrogen polar

APPENDIX

It is added that the present disclosure includes the following inventions [B1] to [B15].

[B1] A gallium nitride crystal including a main surface 1 having an inclination of 0 degrees or more and 10 degrees or less from a (000-1) crystal plane and a main surface 2, having an inclination of 0 degrees or more and 10 degrees or less from a (0001) crystal plane which is a main surface on an opposite side, in which the main surface 1 is a specific main surface A satisfying the following condition (A1).

(A1) A first line segment which is a virtual line segment extending in a first direction on the specific main surface A and having a length of 40 mm and a second line segment which is a virtual line segment extending in a second direction perpendicular to the first direction on the specific main surface A and having a length of 40 mm can be drawn, and a facet growth region density in a random square region of 1 cm×1 cm on the specific main surface A does not exceed 100 cm$^{-2}$.

[B2] A gallium nitride crystal including a main surface 1 having an inclination of 0 degrees or more and 10 degrees or less from a (000-1) crystal plane and a main surface 2, having an inclination of 0 degrees or more and 10 degrees or less from a (0001) crystal plane which is a main surface on an opposite side, in which the main surface 1 is a specific main surface A satisfying the following condition (A2).

(A2) A first line segment which is a virtual line segment extending in a first direction on the specific main surface A and having a length of 40 mm and a second line segment which is a virtual line segment extending in a second direction perpendicular to the first direction on the specific main surface A and having a length of 40 mm can be drawn, and at least one square region of 20 mm×20 mm having a facet growth region density of less than 5 cm$^{-2}$ is found in the specific main surface A.

[B3] A gallium nitride crystal including a main surface 1 having an inclination of 0 degrees or more and 10 degrees or less from a (000-1) crystal plane and a main surface 2, having an inclination of 0 degrees or more and 10 degrees or less from a (0001) crystal plane which is a main surface on an opposite side, in which the main surface 1 is a specific main surface A satisfying the following condition (A3).

(A3) A first line segment which is a virtual line segment extending in a first direction on the specific main surface A and having a length of 40 mm and a second line segment which is a virtual line segment extending in a second direction perpendicular to the first direction on the specific main surface A and having a length of 40 mm can be drawn, and a ratio of a total area of facet growth regions to an area of the specific main surface A (total area of facet growth regions/area of specific main surface A) is 10% or less.

[B4] The gallium nitride crystal according to any one of [B1] to [B3], in which the main surface 1 is a specific main surface A further satisfying the following condition (B1).

(B1) A maximum value of FWHM of an XRC among all measurement points is less than 40 arcsec when an XRC of (002) reflection is measured at an interval of 5 mm on the first line segment with an X-ray incident surface during each w-scan parallel to the first line segment.

[B5] The gallium nitride crystal according to any one of [B1] to [B4], in which the main surface 1 is a specific main surface A further satisfying the following condition (B2).

(B2) A difference between a maximum value and a minimum value of a peak angle of an XRC among all measurement points is less than 0.2° when an XRC of (002) reflection is measured at an interval of 5 mm on the first line segment with an X-ray incident surface during each ω-scan parallel to the first line segment.

[B6] The gallium nitride crystal according to any one of [B1] to [B5], which contains a halogen element in a crystal.

[B7] The gallium nitride crystal according to [B6], in which a halogen element substantially contained is only fluorine.

[B8] The gallium nitride crystal according to any one of [B1] to [B7], in which a dislocation density is less than 1×10$^6$ cm$^{-2}$.

[B9] The gallium nitride crystal according to any one of [B1] to [B8], in which a hydrogen concentration is 2×10$^{19}$ atoms/cm$^3$ or less.

[B10] The gallium nitride crystal according to any one of [B1] to [B9], in which an oxygen concentration is 2×10$^{19}$ atoms/cm$^3$ or less.

[B11] A gallium nitride crystal including: a main surface 1 having an inclination of 0 degrees or more and 10 degrees or less from a (000-1) crystal plane; and a main surface 2, having an inclination of 0 degrees or more and 10 degrees or less from a (0001) crystal plane which is a main surface on an opposite side, in which a thickness in a c-axis direction is 1 mm or more, and an area ratio between a main area 1 and a main area 2 (main area 1/main area 2) is 0.5 or more and 1 or less.

[B12] A gallium nitride crystal including: a main surface 1 having an inclination of 0 degrees or more and 10 degrees or less from a (000-1) crystal plane; and a main surface 2, having an inclination of 0 degrees or more and 10 degrees or less from a (0001) crystal plane which is a main surface on an opposite side, in which a thickness in a c-axis direction is 1 mm or more, and an area ratio between a (10-1-1) plane and a (10-1-2) plane satisfies the following relational expression (C).

$$\text{Area of}(10\text{-}1\text{-}2)\text{plane}/\{\text{area of}(10\text{-}1\text{-}1)\text{plane}+\text{area of}(10\text{-}1\text{-}2)\text{plane}\}<0.5 \tag{C}$$

[B13] A gallium nitride substrate obtained by slicing the gallium nitride crystal according to any one of [B1] to [B12].

[B14] A method for producing a gallium nitride crystal including: a seed preparation step of preparing a GaN seed which is obtained by a liquid phase growth method and has a nitrogen polar surface; and a crystal growth step of growing a GaN crystal on the nitrogen polar surface of the GaN seed by an ammonothermal method by setting a pressure in a reaction vessel containing a mineralizer containing fluorine to 200 MPa or less and a temperature of a crystal growth region to 600° C. or higher.

[B15] The method for producing a gallium nitride crystal according to [B14], in which an area of the nitrogen polar surface of the GaN seed is 30 cm$^2$ or more.

INDUSTRIAL APPLICABILITY

According to the present disclosure, a high-quality GaN crystal with curbed specific defects can be produced. The GaN crystal efficiently produced by the producing method of the present disclosure can be applied not only to blue light emitting diodes (LED) and blue semiconductor lasers (LD) made of nitride-based semiconductors of Group 13 elements of the periodic table, but also to a wide range of applications such as GaN substrates for power semiconductor elements (power devices) and high frequency power devices. Therefore, the industrial applicability of the present disclosure is extremely high.

REFERENCE SIGNS LIST

1 Upper part (raw material dissolution region)
2 Lower part (crystal growth region)

3 Autoclave
4 Raw material
5 Baffle plate
6 Seed crystal (GaN seed)
7 Ag lining
8 Valve
9 Pressure gauge

What is claimed is:

1. A gallium nitride crystal which contains F and in which a total content of halogen elements other than F is $\frac{1}{100}$ or less of a content of F, the gallium nitride crystal comprising a main surface 1 having an inclination of 0 degrees or more and 10 degrees or less from a (000-1) crystal plane, wherein the main surface 1 is a specific main surface A satisfying at least one of the following conditions (A1) to (A3):

(A1) a first line segment which is a virtual line segment extending in a first direction on the specific main surface A and having a length of 40 mm and a second line segment which is a virtual line segment extending in a second direction perpendicular to the first direction on the specific main surface A and having a length of 40 mm can be drawn, and a facet growth region density in a random square region of 10 mm×10 mm on the specific main surface A does not exceed 500 cm$^{-2}$;

(A2) a first line segment which is a virtual line segment extending in a first direction on the specific main surface A and having a length of 40 mm and a second line segment which is a virtual line segment extending in a second direction perpendicular to the first direction on the specific main surface A and having a length of 40 mm can be drawn, and at least one square region of 20 mm×20 mm having a facet growth region density of less than 5 cm$^{-2}$ is found in the specific main surface A; and (A3) a first line segment which is a virtual line segment extending in a first direction on the specific main surface A and having a length of 40 mm and a second line segment which is a virtual line segment extending in a second direction perpendicular to the first direction on the specific main surface A and having a length of 40 mm can be drawn, and a ratio of a total area of facet growth regions to an area of the specific main surface A (total area of facet growth regions/area of specific main surface A) is 40% or less.

2. The gallium nitride crystal according to claim 1, further comprising: a main surface 2 having an inclination of 0 degrees or more and 10 degrees or less from a (0001) crystal plane which is a main surface on an opposite side.

3. The gallium nitride crystal according to claim 1, wherein fluorine is contained at a concentration of 1×10$^{15}$ atoms/cm$^3$ or more and 1×10$^{18}$ atoms/cm$^3$ or less.

4. The gallium nitride crystal according to claim 1, wherein the main surface 1 includes a specific main surface A that simultaneously satisfies the condition (A1) and the condition (A2) or the condition (A3), or the main surface 1 includes a specific main surface A that simultaneously satisfies the condition (A1), the condition (A2), and the condition (A3).

5. The gallium nitride crystal according to claim 1, wherein the main surface 1 includes a specific main surface A that simultaneously satisfies the condition (A2) and the condition (A3).

6. The gallium nitride crystal according to claim 1, wherein the main surface 1 is a specific main surface A further satisfying the following condition (B1):

(B1) a maximum value of FWHM of an XRC among all measurement points is less than 40 arcsec when an XRC of 002 reflection is measured at an interval of 5 mm on the first line segment with an X-ray incident surface during each @-scan parallel to the first line segment.

7. The gallium nitride crystal according to claim 1, wherein the main surface 1 is a specific main surface A further satisfying the following condition (B2):

(B2) a difference between a maximum value and a minimum value of a peak angle of an XRC among all measurement points is less than 0.2° when an XRC of 002 reflection is measured at an interval of 5 mm on the first line segment with an X-ray incident surface during each ω-scan parallel to the first line segment.

8. The gallium nitride crystal according to claim 1, wherein a dislocation density is less than 1×10$^6$ cm$^{-2}$.

9. The gallium nitride crystal according to claim 1, wherein a hydrogen concentration is 2×10$^{19}$ atoms/cm$^3$ or less.

10. The gallium nitride crystal according to claim 1, wherein an oxygen concentration is 2×10$^{19}$ atoms/cm$^3$ or less.

11. A gallium nitride crystal comprising: a main surface 1 having an inclination of 0 degrees or more and 10 degrees or less from a (000-1) crystal plane; and a main surface 2 having an inclination of 0 degrees or more and 10 degrees or less from a (0001) crystal plane which is a main surface on an opposite side, wherein a thickness in a c-axis direction is 1 mm or more, and an area ratio between the main area 1 and the main area 2 (main area 1/main area 2) is 0.5 or more and 1 or less, or an area ratio between a (10-1-1) plane and a (10-1-2) plane satisfies the following relational expression (C):

$$\text{area of(10-1-2)plane/\{area of(10-1-1)plane+area of(10-1-2)plane\}}<0.5 \quad (C).$$

12. The gallium nitride crystal according to claim 11, wherein an area ratio between the main area 1 and the main area 2 (main area 1/main area 2) is 0.5 or more and 1 or less.

13. The gallium nitride crystal according to claim 11, wherein an area ratio between a (10-1-1) plane and a (10-1-2) plane satisfies the following relational expression (C):

$$\text{area of(10-1-2)plane/\{area of(10-1-1)plane+area of(10-1-2)plane\}}<0.5 \quad (C).$$

14. A gallium nitride substrate obtained by slicing the gallium nitride crystal according to claim 1.

15. A gallium nitride substrate obtained by slicing the gallium nitride crystal according to claim 12.

16. A gallium nitride substrate obtained by slicing the gallium nitride crystal according to claim 13.

* * * * *